(12) United States Patent
Kim et al.

(10) Patent No.: US 7,192,873 B1
(45) Date of Patent: Mar. 20, 2007

(54) METHOD OF MANUFACTURING NANO SCALE SEMICONDUCTOR DEVICE USING NANO PARTICLES

(75) Inventors: Hoon Kim, Gyeonggi-do (KR); In-jae Song, Gueonggi-do (KR); Won-joo Kim, Gyeonggi-do (KR); Byoung-Iyong Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/240,473

(22) Filed: Oct. 3, 2005

(30) Foreign Application Priority Data

Nov. 25, 2004 (KR) ........................ 10-2004-0097594

(51) Int. Cl.
*H01L 21/311* (2006.01)
(52) U.S. Cl. .................... 438/702; 438/692; 438/183; 977/755; 977/758; 977/773
(58) Field of Classification Search ................ 438/183, 438/692, 702, 947; 977/755, 758, 773
See application file for complete search history.

(56) References Cited

U.S. PATENT DOCUMENTS 4,407,695 A  10/1983  Deckman et al.
6,187,603 B1 *  2/2001  Haven et al. ................. 438/20
2005/0189318 A1 *  9/2005  Bearda et al. ................ 216/41

FOREIGN PATENT DOCUMENTS

KR  1991-0008800  5/1991
KR  2000-0016555  3/2000

OTHER PUBLICATIONS

Wolf et al., Silicon Processing for the VLSI Era, vol. 1: Process Technology, 1986 by Lattice Press, pp. 280, 281 and 321-323.*
*Korean Office Action dated Mar. 17, 2006.

* cited by examiner

*Primary Examiner*—George Fourson
*Assistant Examiner*—Julio J. Maldonado
(74) *Attorney, Agent, or Firm*—Buchanan Ingersoll & Rooney PC

(57) ABSTRACT

Provided is a method of manufacturing a nano scale semiconductor device, such as a nano scale P-N junction device or a CMOS using nano particles without using a mask or a fine pattern. The method includes dispersing uniformly a plurality of nano particles on a semiconductor substrate, forming an insulating layer covering the nano particles on the semiconductor substrate, partly removing the upper surfaces of the nano particles and the insulating layer, selectively removing the nano particles from the insulating layer, and partly forming doped semiconductor layers in the semiconductor substrate by partly doping the semiconductor substrate through spaces formed by removing the nano particles.

21 Claims, 7 Drawing Sheets

FIG. 5G

METHOD OF MANUFACTURING NANO SCALE SEMICONDUCTOR DEVICE USING NANO PARTICLES

BACKGROUND OF THE INVENTION

This application claims the priority of Korean Patent Application No. 10-2004-0097594, filed on Nov. 25, 2004, in the Korean Intellectual Property Office, the disclosure of which is incorporated herein in its entirety by reference.

1. Field of the Invention

The present invention relates to a method of manufacturing nano scale semiconductor devices using nano particles, and more particularly, to a method of manufacturing nano scale semiconductor devices such as P-N junction device or Complementary Metal-Oxide Semiconductors (CMOS) using nano particles without a mask or a fine pattern.

2. Description of the Related Art

As the increase in the semiconductor technologies, the integration density of semiconductor devices increases. The micro lithography technique largely contributed to the high integration of the semiconductor devices. However, the basic technologies for manufacturing the semiconductor devices do not have changed significantly. That is, material layers were stacked on a substrate, and after forming a mask using a photoresist on the material layer, the mask was patterned through a micro lithography process. Afterward, the mask and the material layer were selectively etched under an appropriate gas atmosphere. The research for increasing the integration density of a semiconductor device is mainly concentrated on the technique for fine patterning a mask using a light source having a short wavelength and the technique for etching appropriately the fine pattern.

However, there is a limit to the technique for fine patterning a mask using the optical technique. At the present time, it is prevailed to manufacturing a semiconductor device having a line width of 90 nm, and there are many difficulties to pattern below that level. Accordingly, a new technique to increase the integration density of a semiconductor device is needed. The new technique for manufacturing semiconductor devices is a manufacturing technique using nano particles.

Figure 1A:
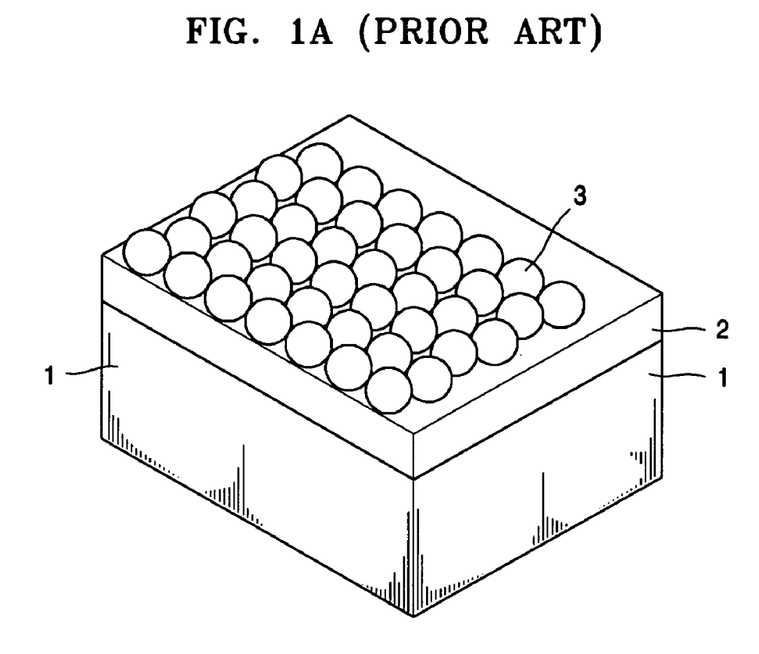
FIGS. 1A and 1B are perspective views illustrating a conventional method of manufacturing a nano structure using nano particles.
Figure 1B:
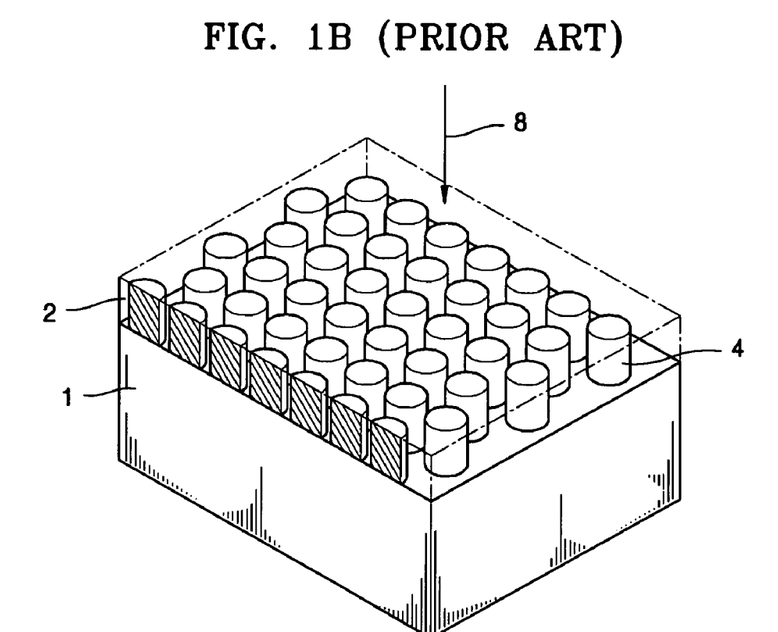

The method of manufacturing a nano structure has been disclosed in U.S. Pat. No. 4,407,695 in "Natural lithographic fabrication of microstructures over large areas". According to the U.S. Pat. No. 4,407,695, as depicted in FIG. 1A, a material layer 2 is formed on a substrate 1, and nano particles 3 are coated on the material layer 2. Afterward, as depicted in FIG. 1B, an etching process is performed by irradiating ion beams 8 vertically to the coated nano particles 3. Then, cylinder shaped nano structures 4 are formed on the substrate 1 by removing the exposed portions to the ion beams 8.

However, in the U.S. Pat. No. 4,407,695, the nano particles are used only as masks. Therefore, the method proposed in the U.S. Pat. No. 4,407,695 can only a simple structure as depicted in FIG. 1B and the complicated conventional processes using a photoresist can not be simplified.

SUMMARY OF THE INVENTION

The present invention provides a method of manufacturing nano scale semiconductor devices, such as a nano scale P-N junction device or a nano scale CMOS without a fine pattern or a mask.

The present invention also provides a simple method of manufacturing semiconductor devices without a mask or a fine pattern.

According to an aspect of the present invention, there is provided a method of manufacturing a nano scale semiconductor, the method comprising: dispersing uniformly a plurality of nano particles on a semiconductor substrate; forming an insulating layer covering the nano particles on the semiconductor substrate; partly removing upper surfaces of the nano particles and the insulating layer; selectively removing the nano particles in the insulating layers; and partly forming doped semiconductor layers in the semiconductor substrate by partly doping the semiconductor substrate through spaces formed by removing the nano particles.

Here, the diameter of the nano particles is less than 30 nm, and the nano particles are formed one of a metal material and a semiconductor.

The method can further comprise expanding the exposed portions of the semiconductor substrate to the outside by partly removing lower parts of side walls of the insulating layer where the nano particles are removed after selectively removing the nano particles in the insulating layer.

The partly doping of the semiconductor substrate is performed by injecting or diffusing a dopant in the semiconductor substrate.

At this time, the semiconductor substrate can be a p-type semiconductor substrate and the doped semiconductor layers in the semiconductor substrate are n-type semiconductor layers. Also, the semiconductor substrate can be an n-type semiconductor substrate and the doped semiconductor layers in the semiconductor substrate are p-type semiconductor layers.

The method of manufacturing a semiconductor device can further comprise: forming metal layers on upper surfaces of the doped semiconductor layers; exposing the semiconductor substrate by selectively removing the insulating layer; depositing a dielectric layer having a uniform thickness on the semiconductor substrate, upper and side surfaces of the metal layers; depositing a polycrystalline silicon layer on the dielectric layer; and removing the dielectric layer and the polycrystalline silicon layer until the metal layer is exposed.

Here, the forming a metal layer on an upper surface of the doped semiconductor layers includes: depositing a metal material on an entire surface of the doped semiconductor layers and the insulating layer; and removing and planarizing the metal material until the insulating layer is exposed.

The depositing a dielectric layer in a uniform thickness on an upper surface of the semiconductor substrate and the metal layers and side surfaces of the metal layers is performed using an atomic layer deposition (ALD) technique.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown.

Figure 2A:
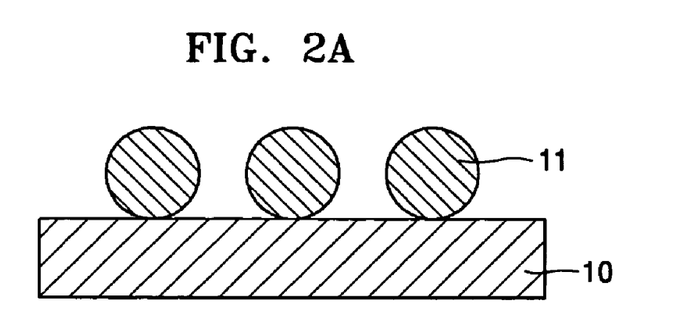
FIGS. 2A through 2C are cross-sectional views illustrating the basic concept of manufacturing a semiconductor device according to an embodiment of the present invention.
Figure 2B:
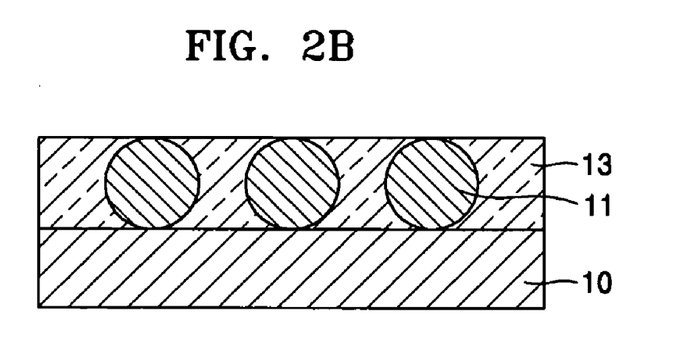
Figure 2C:
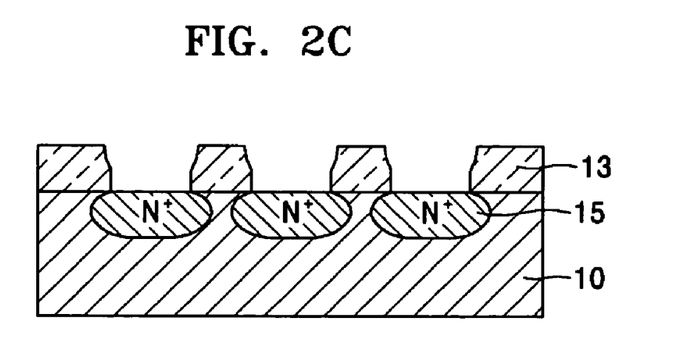

FIGS. 2A through 2C are cross-sectional views illustrating a basic concept of manufacturing a semiconductor device according to an embodiment of the present invention.

Referring to FIG. 2A, nano particles 11 having a predetermined diameter are arranged a predetermined distance apart from each other on a substrate 10. Afterward, as depicted in FIG. 2B, an insulating layer 13 covering all the nano particles 11 is formed on the substrate 10. Next, as depicted in FIG. 2C, after selectively removing the nano particles 11, the portions of the substrate 10 exposed where the nano particles 11 were removed are doped with p-doping or n-doping by injecting or diffusing. Then, various nano scale semiconductor devices can be manufactured by performing additional processes according to the purpose of the semiconductor devices.

In the conventional art, to produce the above nano structure, complicated processes must be performed. That is, a p-type semiconductor layer or an n-type semiconductor layer is formed on a substrate and finely patterned the semiconductor layer using a micro lithography process, and then, an insulating material is filled the pattern. However, in the present invention, unlike the conventional art, no micro lithography process is performed. Therefore, the present invention is cheaper than the conventional. Moreover, the present invention can pattern a p-type semiconductor layer or an n-type semiconductor layer to a few nm by selecting an appropriate diameter of the nano particles 11 and the distance between the nano particles 11, whereas, in the conventional art, a width of less than 90 nm was impossible.

A method of manufacturing a semiconductor device using the above described concept will now be described.

FIGS. 3A through 3F are cross-sectional views illustrating a method of manufacturing a nano scale P-N junction device using nano particles according to an embodiment of the present invention.

Figure 3A:
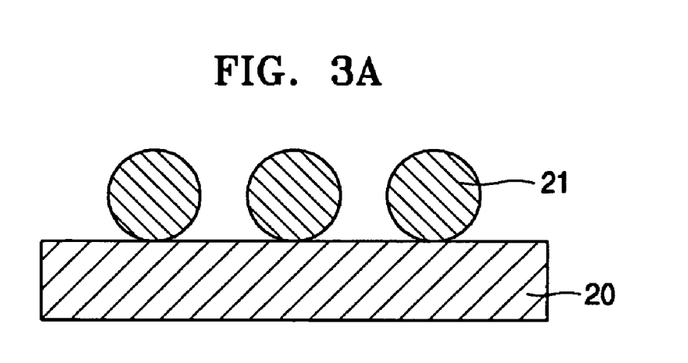
FIGS. 3A through 3F are cross-sectional views illustrating a method of manufacturing a nano scale P-N junction device using nano particles according to an embodiment of the present invention.
Figure 3B:
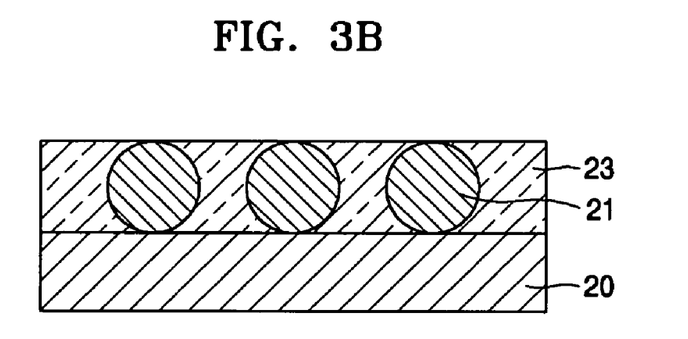
Figure 3C:
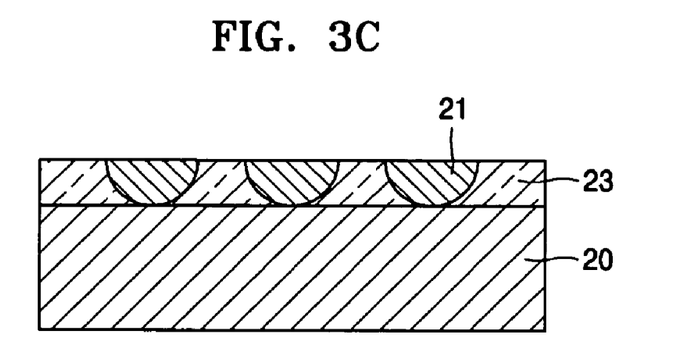

Referring to FIG. 3A, ball shaped nano particles 21 are uniformly dispersed on an n-Si or a n-type substrate 20. The diameter of the nano particles 21 may be less than 30 nm. The material for the nano particles 21 can be a semiconductor material such as silicon or a metal. As depicted in FIG. 3B, an insulating layer 23 is formed by growing or depositing an insulating material on the substrate 20 and the nano particles 21. At this time, the insulating layer 23 can be thick enough to over the nano particles 21. The insulating material can be a metal oxide or a nitride. Afterward, as depicted in FIG. 3C, the insulating layer 23 and the nano particles 21 are planarized by partially removing the insulating layer 23 and the nano particles 21 using chemical mechanical polishing (CMP). In this case, preferably, the planarizing is performed until the half ball of the nano particles 21 is removed. Then, the nano particles 21 covered by the insulating layer 23 are exposed.

Figure 3D:
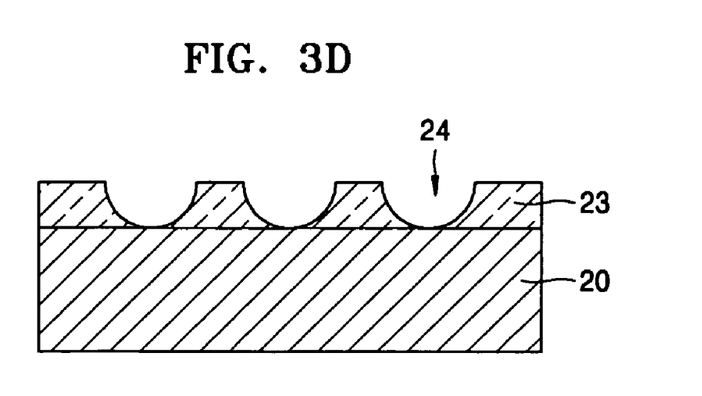
Figure 3E:
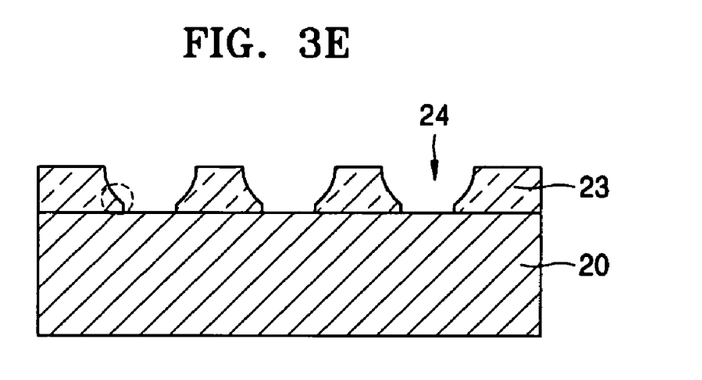

Referring to FIG. 3D, the exposed nano particles 21 are selectively removed through an etching process leaving the insulating layer 23. Spaces 24 having a hemispherical shape are left in the insulating layer 23 by removing the nano particles 21. At this time, the substrate 20 is partly exposed on the bottom of the spaces 24. Afterward, as depicted in FIG. 3E, the bottom portion of the spaces 24 are expanded using dry etching to increase the lateral diffusion profile into side walls in a process for injecting or diffusing a dopant. That is, the exposure of the substrate 20 is increased by partly removing the lower side walls of the insulating layer 23 in the spaces 24.

Figure 3F:
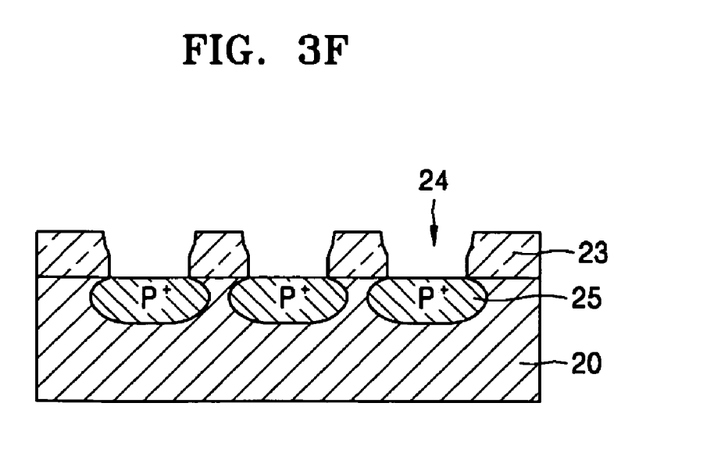

The exposed substrate 20 is partly doped with a p-type dopant by injecting or diffusing an appropriate p-type dopant. The dopant can be boron (B). Then, as depicted in FIG. 3F, a p-type semiconductor layer 25 is formed in the substrate 20 where the nano particles 21 are placed. According to the present invention, a nano scale semiconductor layer can be formed since the size of the p-type semiconductor layer 25 depends on the size of the nano particles 21.

In the present invention, a p-type semiconductor layer 25 is formed in the n-type substrate 20, but the present invention is not limited thereto. That is, an n-type semiconductor layer can be formed in the p-type substrate 20, and in this case, the dopant can be phosphorus (P).

Figure 4:
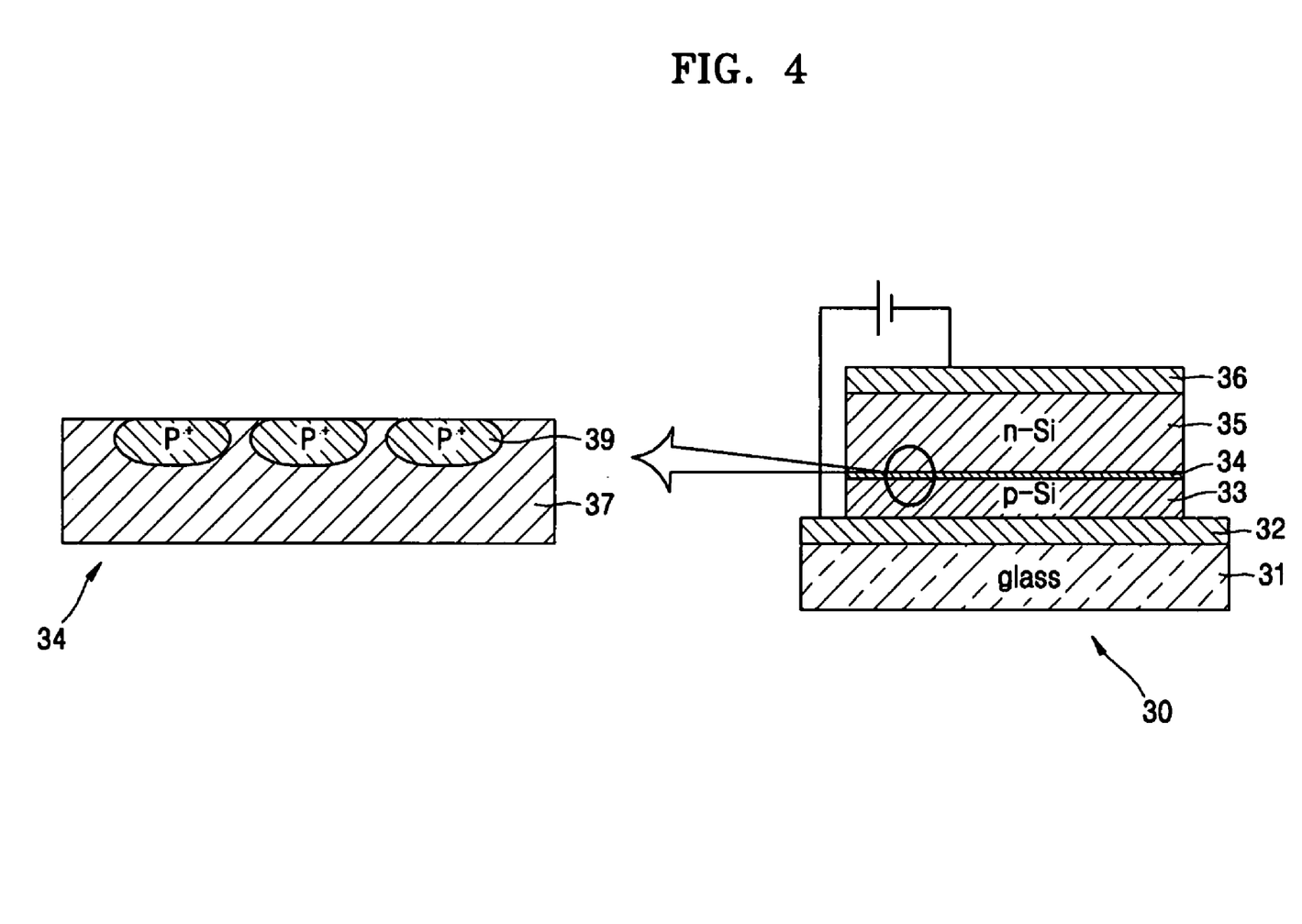
FIG. 4 is a cross-sectional view illustrating a light emitting diode (LED) using the nano scale P-N junction device according to the embodiment of the present invention.

As described above, nano scale junction device formed without a mask or a fine pattern can be used to an LED 30 as depicted in FIG. 4. Referring to FIG. 4, the LED 30 is composed of a substrate 31, a lower electrode 32, a p-type semiconductor layer 33, a P-N junction device 34, an n-type semiconductor layer 35, and an upper electrode 36. As described above, the P-N junction device 34 includes a plurality of p-type semiconductor layer 39 formed in a nano size in the n-type substrate 37. The p-type semiconductor layer 33 and the n-type semiconductor layer 35 supply holes and electrons to a p-n junction surface of the P-N junction device 34. The nano scale P-N junction device 34 can be especially useful for manufacturing a high efficiency and high brightness LED since multiple structures of quantum dots and quantum wells are formed on a very tiny region and holes and electrons are concentrated on the quantum dots and quantum wells. Therefore, the smaller the p-type semiconductor layer 39 in the P-N junction device 34, the better. According to the present invention, the width and height of the p-type semiconductor layer 39 in the P-N junction device 34 can be formed to approximately 20–30 nm due to process limitation of CMP (at the present time, upto 20±1 nm is possible). However, as described above, the patterning limit is 90 nm when using a lithography mask.

FIGS. 5A through 5G are cross-sectional views illustrating a method of manufacturing a nano scale CMOS using nano particles according to an embodiment of the present invention.

Figure 5A:
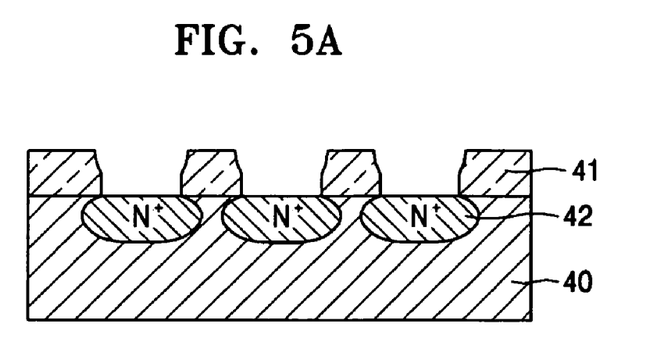
FIGS. 5A through 5G are cross-sectional views illustrating a method of manufacturing a nano scale CMOS using nano particles according to an embodiment of the present invention.

Referring to FIG. 5A, the processes for forming the nano size p-type or n-type semiconductor layers by injecting or diffusing a dopant partly in a substrate are the same as described with reference to FIGS. 3A through 3F. That is, a plurality of nano particles are dispersed on a substrate; an insulating layer is formed on the nano particles; the nano particles are removed through CMP and etching; and a dopant is injected or diffused in the substrate through a space formed in the insulating layer. In the present embodiment, the substrate 40 is a p-type semiconductor substrate, such as p-Si. As depicted in FIG. 5, a plurality of n-type semiconductor layers 42 is formed by injecting a dopant, such as P, through an exposed portion of the substrate 40 in a space of the insulating layer 41. The formed n-type semiconductor layers 42 have a size of approximately 20–30 nm.

Figure 5B:
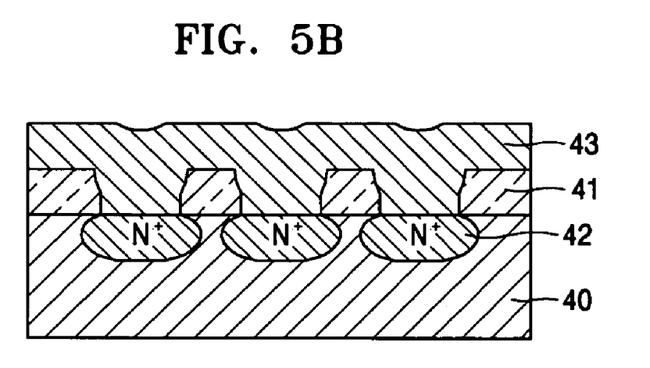
Figure 5C:
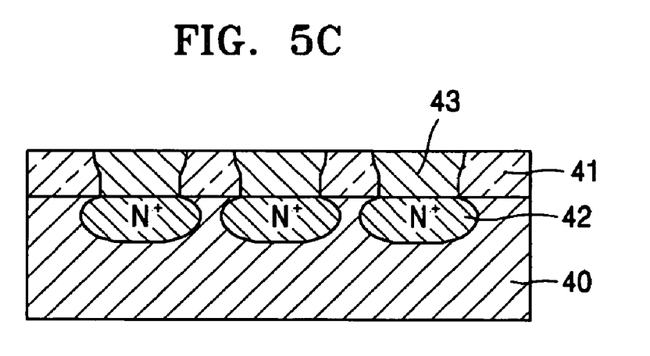
Figure 5D:
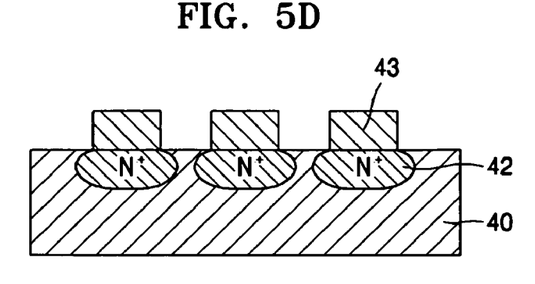

Afterward, as depicted in FIGS. 5B and 5C, a metal material 43 is deposited on the insulating layer 41 and the n-type semiconductor layer 42. The metal material 43 can be deposited using a conventional method, such as chemical vapor deposition (CVD) or sputtering. Next, the metal material 43 formed on the insulating layer 41 is removed using CMP. As a result, as depicted in FIG. 5D, only metal layers 43, deposited in the spaces left by removing the nano particles, remain. That is, the metal layers 43 exist only on the n-type semiconductor layers 42. The metal layers 43 formed in this way will be used as source or drain electrodes.

Figure 5E:
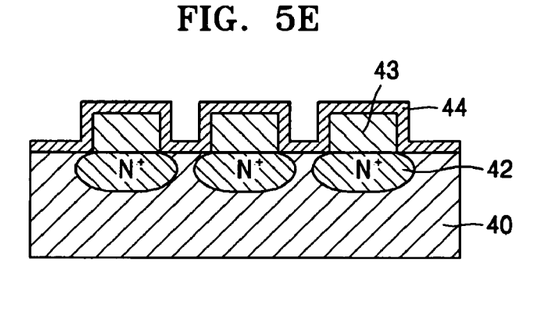

As depicted in FIG. 5D, only the metal layer 43 are left on the n-type semiconductor layer 42 by selectively removing the residual insulating layer 41. Accordingly, the substrate 40 is exposed between the metal layers 43. Afterward, as depicted in FIG. 5E, a thin dielectric layer 44 having a high dielectric constant (H-k) is deposited on an upper surface of the substrate 40 and the metal layer 43 and on side surfaces of the metal layer 43, using atomic layer deposition (ALD). ALD is a technique for growing thin film in atom layer units using a surface reaction, and can easily control the thickness of the thin film since the thickness of the thin film is determined according to the number of deposition cycles. In the present embodiment, the dielectric layer 44 having a high dielectric constant can be deposited to a thickness of within 20 nm. The dielectric layer 44 has a greater dielectric constant (greater than 5) than a conventional silicon oxide film. The dielectric layer 44 acts as a gate oxide. Various metal oxides can be used for forming the dielectric layer 44.

Figure 5F:
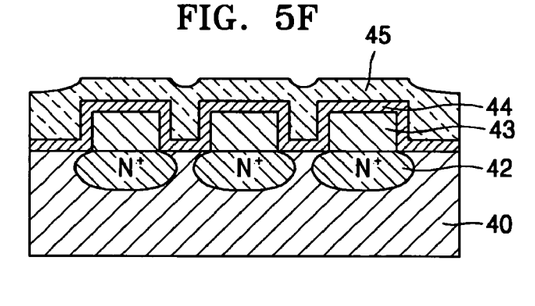
Figure 5G:
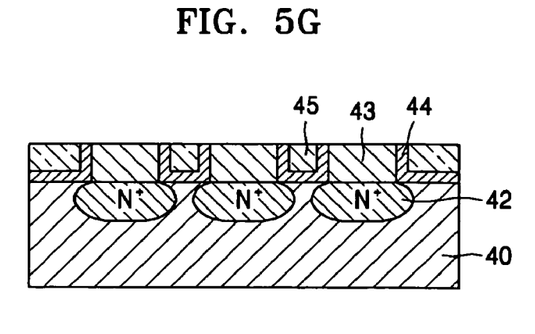

Referring to FIG. 5F, a poly-Si layer 45 is deposited or grown on the metal oxide dielectric layer 44. Next, as depicted in FIG. 5G, the CMOS is completed by partly removing and planarizing the poly-Si layer 45 and the metal oxide dielectric layer 44 until the metal layer 43 is exposed using CMP. In the CMOS formed according to the present invention, the gap between the source and drain and the height can be formed approximately less than 20–30 nm. Therefore, the integration density of a semiconductor device can be increased, since a CMOS much smaller than the conventional CMOS can be manufactured.

As described above, according to the present invention, a semiconductor can be manufactured without using lithography, which is a complicated, time consuming, and expensive. Also, according to the present invention, it is impossible to manufacture a device having a line width of less than 30 nm, far below the 90 nm limit of current technology. Therefore, the integration density of a semiconductor device can be greatly increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a nano scale semiconductor, the method comprising:
    dispersing uniformly a plurality of nano particles on a semiconductor substrate;
    forming an insulating layer covering the nano particles on the semiconductor substrate;
    partly removing upper surfaces of the nano particles and the insulating layer;
    selectively removing the nano particles from the insulating layer; and
    partly forming doped semiconductor layers in the semiconductor substrate by doping the semiconductor substrate through spaces formed by removing the nano particles.

2. The method of claim 1, wherein the diameter of the nano particles is less than 30 nm.

3. The method of claim 2, wherein the nano particles are formed of a metal material or a semiconductor.

4. The method of claim 1, wherein the partly removing the upper surfaces of the nano particles and the insulating layer is performed until the upper hemispheres of the nano particles is removed.

5. The method of claim 1 further comprising expanding the exposed portions of the semiconductor substrate by partly removing the lower parts of the side walls of the insulating layer where the nano particles were removed after selectively removing the nano particles in the insulating layer.

6. The method of claim 5, wherein the removing a portion of the insulating layer from where the nano particles are removed is performed by dry etching.

7. The method of claim 1, wherein the partly doping of the semiconductor substrate is performed by injecting or diffusing a dopant in the semiconductor substrate.

8. The method of claim 1, wherein the semiconductor substrate is a p-type semiconductor substrate and the partly doped semiconductor layers in the semiconductor substrate are n-type semiconductor layers.

9. The method of claim 1, wherein the semiconductor substrate is an n-type semiconductor substrate and the partly doped semiconductor layers in the semiconductor substrate are p-type semiconductor layers.

10. A method of manufacturing a nano scale semiconductor device, the method comprising:
    dispersing uniformly a plurality of nano particles on a semiconductor substrate;
    forming an insulating layer covering the nano particles on the semiconductor substrate;
    partly removing the upper surfaces of the nano particles and the insulating layer;
    selectively removing the nano particles in the insulating layer; and
    partly forming doped semiconductor layers in the semiconductor substrate by doping the semiconductor substrate through spaces formed by removing the nano particles;
    forming metal layers on upper surfaces of the doped semiconductor layers;
    exposing the semiconductor substrate by selectively removing the insulating layer;
    depositing a dielectric layer having a uniform thickness on the semiconductor substrate, upper and side surfaces of the metal layers;
    depositing a polycrystalline silicon layer on the dielectric layer; and
    removing the dielectric layer and the polycrystalline silicon layer until the metal layer is exposed.

11. The method of claim 10, wherein the diameter of the nano particles is less than 30 nm.

12. The method of claim 11, wherein the nano particles are formed one of a metal material and a semiconductor.

13. The method of claim 10, wherein the partly removing of the upper surfaces of the nano particles and the insulating layer is performed until the upper hemispheres of the nano particle balls is removed.

14. The method of claim 10 further comprising expanding the exposed portions of the substrate by partly removing the lower parts of the side walls of the insulating layer where the nano particles are removed, after selectively removing the nano particles in the insulating layer.

15. The method of claim 14, wherein the partly removing of the insulating layer from where the nano particles were removed is performed by dry etching.

16. The method of claim 10, wherein the partly doping the semiconductor substrate is performed by injecting or diffusing a dopant in the semiconductor substrate.

17. The method of claim 10, wherein the semiconductor substrate is a p-type semiconductor substrate and the partly doped semiconductor layers in the semiconductor substrate are n-type semiconductor layers.

18. The method of claim 10, wherein the semiconductor substrate is an n-type semiconductor substrate and the partly doped semiconductor layers in the semiconductor substrate are p-type semiconductor layers.

19. The method of claim 10, wherein the formation of a metal layer on an upper surface of the doped semiconductor layers includes:

depositing a metal material on an entire surface of the doped semiconductor layers and the insulating layer; and removing and planarizing the metal material until the insulating layer is exposed.

20. The method of claim 10, wherein the deposition of a dielectric layer to a uniform thickness on an upper surface of the semiconductor substrate and the metal layers and side surfaces of the metal layers is performed using an atomic layer deposition (ALD).

21. The method of claim 20, wherein the dielectric layer is a metal oxide having a high dielectric constant.

* * * * *